(12) United States Patent
Moriya et al.

(10) Patent No.: US 8,194,162 B2
(45) Date of Patent: Jun. 5, 2012

(54) IMAGING DEVICE

(75) Inventors: Susumu Moriya, Yokohama (JP); Izumi Kobayashi, Yokohama (JP); Takao Ohno, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 143 days.

(21) Appl. No.: 12/720,949

(22) Filed: Mar. 10, 2010

(65) Prior Publication Data

US 2010/0231766 A1 Sep. 16, 2010

(30) Foreign Application Priority Data

Mar. 11, 2009 (JP) ................... 2009-057558

(51) Int. Cl.
*H04N 3/14* (2006.01)
*H04N 5/335* (2011.01)

(52) U.S. Cl. ........ 348/294; 348/298; 348/302; 348/308; 348/312

(58) Field of Classification Search .................. 348/294, 348/302, 308, 312; 250/208.1; 257/290–292
See application file for complete search history.

(56) References Cited

U.S. PATENT DOCUMENTS

| | | | |
|---|---|---|---|
| 6,492,699 B1 | 12/2002 | Glenn et al. | |
| 7,566,854 B2 | 7/2009 | Yang et al. | |
| 2008/0135728 A1 | 6/2008 | Yang et al. | |
| 2010/0084694 A1* | 4/2010 | Kim .............................. | 257/292 |

FOREIGN PATENT DOCUMENTS

| | | |
|---|---|---|
| JP | 2003-169235 A | 6/2003 |
| JP | 2008-167426 A | 7/2008 |

* cited by examiner

*Primary Examiner* — Yogesh Aggarwal
(74) *Attorney, Agent, or Firm* — Westerman, Hattori, Daniels & Adrian, LLP

(57) ABSTRACT

An imaging device includes an image sensing device provided on a semiconductor substrate; a transparent member provided on a light-receiving area of the image sensing device; and a circuit element provided on the transparent member, wherein the image sensing device and the circuit element are electrically coupled to each other.

6 Claims, 16 Drawing Sheets

IMAGING DEVICE

CROSS-REFERENCE TO RELATED APPLICATIONS

This application is based upon and claims the benefit of priority of the prior Japanese Patent Application No. 2009-57558, filed on Mar. 11, 2009, the entire contents of which are incorporated herein by reference.

FIELD

The present invention relates to an imaging device, and more particularly, to an imaging device equipped with a solid-state image sensing device and a circuit element that forms a peripheral circuit of the solid-state image sensing device.

BACKGROUND

With reduction in size and weight of electronic apparatuses such as mobile telephones, imaging devices mounted in the electronic apparatuses are also required to be reduced in size and weight.

In the imaging devices, a solid-state image sensing device, such as a complementary metal-oxide semiconductor (CMOS) image sensor or a charge coupled device (CCD) image sensor, is adopted as an image sensing device. Further, a so-called chip size package (CSP) structure is adopted for the purpose of size reduction.

FIG. 14 illustrates an example of an imaging device module that includes an imaging device having a CSP structure.

In this imaging device module, an imaging device 90 includes a solid-state image sensing device 91, and a transparent member 93 fixed to an upper surface of the solid-state image sensing device 91 with adhesive 92.

In this configuration, air is contained in a space 94 defined between a light-receiving area 91A of the solid-state image sensing device 91 and the transparent member 93. Electrodes 95 on the upper surface of the solid-state image sensing device 91 are led out via electrodes 96 extending through a semiconductor substrate 91S, wires 97, and convex external connection terminals 98 that constitute the solid-state image sensing device 91.

The imaging device 90 is mounted and connected onto electrodes 111 on a wiring board 110 with the external connection terminals 98 being disposed therebetween. Circuit elements 112, such as a control integrated circuit element, a resistor element, and a capacitative element, are connected to the electrodes 111 with adhesive 113 such as solder.

On the wiring board 110, a lens holder 120 holding a lens is mounted in a manner such that a lens unit 121 is positioned in correspondence with the light-receiving area 91A of the solid-state image sensing device 91.

The lens unit 121 includes lenses 122A and 122B and diaphragms 123A and 123B. The lens holder 120 itself is lightproof.

Such an imaging device module in which a solid-state image sensing device and circuit elements are mounted on one principal surface of a wiring board and are covered with a lens unit is disclosed in, for example, Japanese Laid-Open Patent Publication No. 2003-169235 or Japanese Laid-Open Patent Publication No. 2008-167426.

U.S. Pat. No. 6,492,699 discloses that cutouts are provided in a peripheral edge portion of the principal surface (upper surface) of a transparent member arranged on a solid-state image sensing device.

In the above-described imaging device module, however, the wiring board 110 needs a large area because the imaging device 90 and the circuit elements 112 are arranged side by side on the wiring board 110. Hence, it is difficult to meet the demand to reduce the size of the imaging device module.

In the configuration illustrated in FIG. 14, the wire length between the upper electrodes of the solid-state image sensing device and the circuit elements is sometimes up to about 5 mm.

Such a large wire length increases the wiring resistance and also increases the influence of external noise. It is therefore difficult for the imaging device module to operate stably.

Accordingly, a technique that realizes size reduction of an imaging device without deteriorating electrical characteristics is expected.

SUMMARY

According to one aspect of the invention, an imaging device includes an image sensing device provided on a semiconductor substrate; a transparent member provided on a light-receiving area of the image sensing device; and a circuit element provided on the transparent member, wherein the image sensing device and the circuit element are electrically coupled to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION OF THE EMBODIMENTS

Imaging devices according to embodiments of the present invention will be described below with reference to the drawings.

First Embodiment

Figure 1:
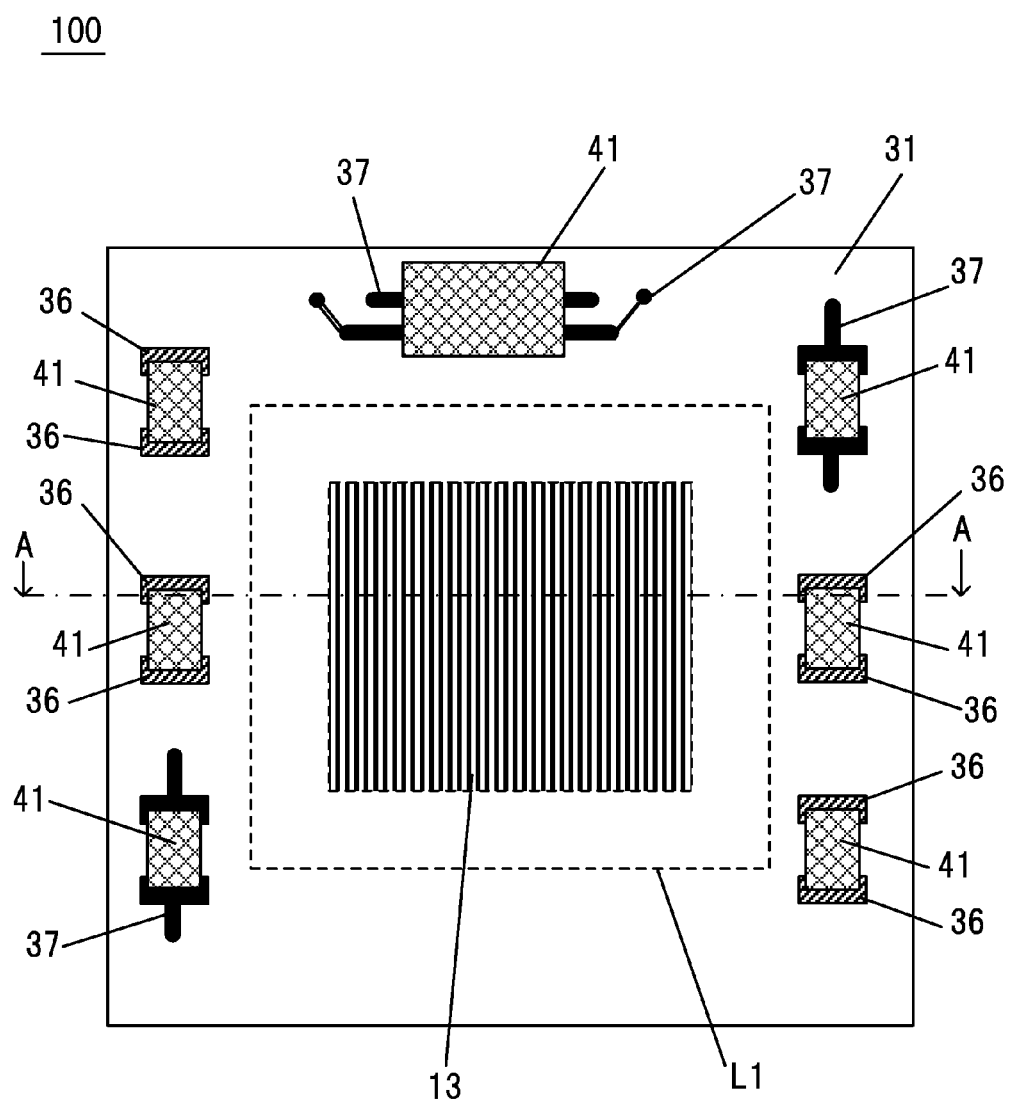
FIG. 1 is a top view of an imaging device according to a first embodiment of the present invention.
Figure 2:
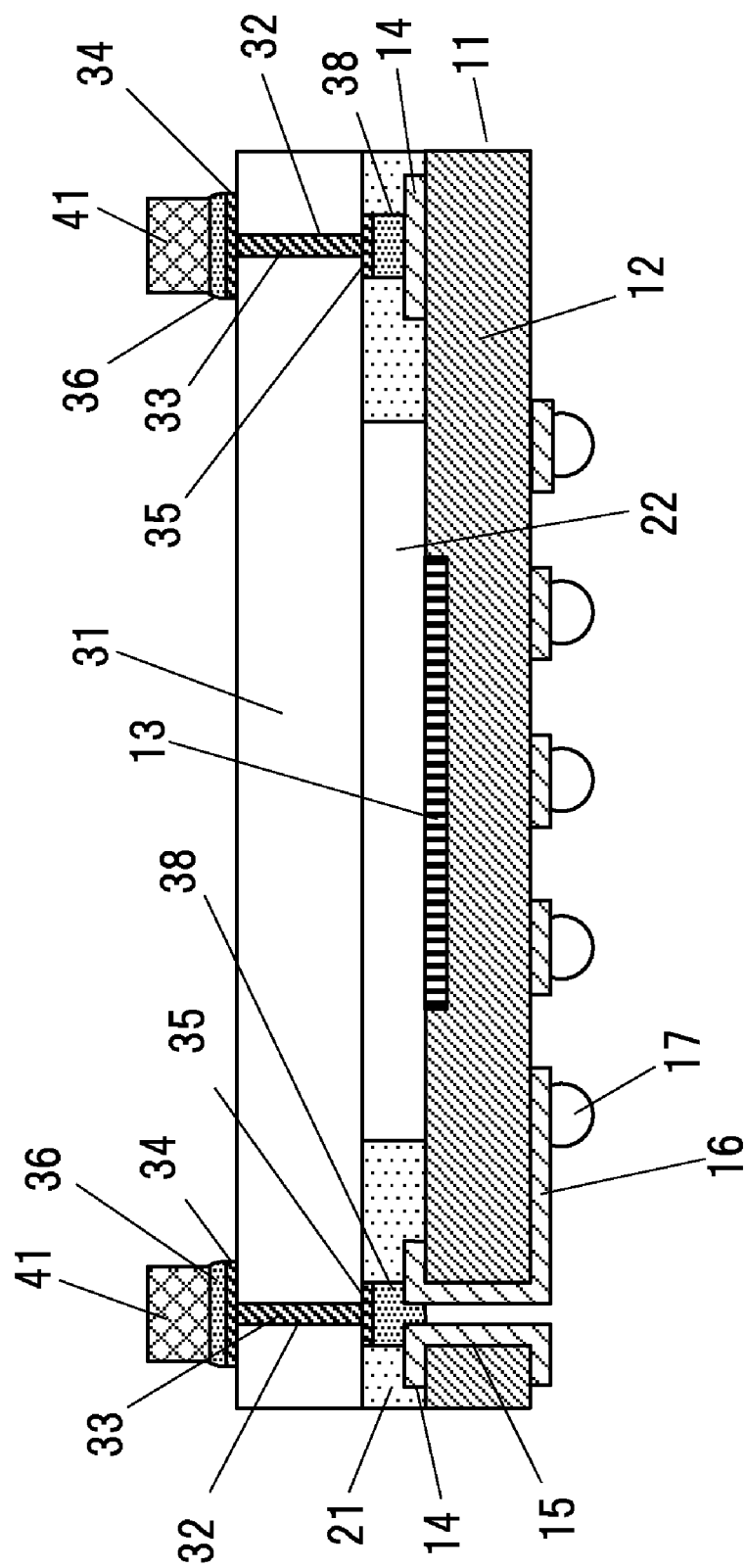
FIG. 2 is a cross-sectional view illustrating a structure of the principal part of the imaging device of the first embodiment.

FIGS. 1 and 2 illustrate an imaging device according to a first embodiment of the present invention.

FIG. 1 is a plan view of the imaging device of the first embodiment, and FIG. 2 is a cross-sectional view taken along line A-A in FIG. 1.

In an imaging device 100 of the first embodiment, a plate-shaped transparent member 31 is provided on a light-receiving surface of a solid-state image sensing device 11 formed by a CCD image sensor or a CMOS image sensor.

Circuit elements 41 are provided at positions on the transparent member 31 that do not have any influence on a light-receiving area 13 of the solid-state image sensing device 11.

In other words, in the solid-state image sensing device 11 formed by a CCD image sensor or a CMOS image sensor, the light-receiving area (imaging area) 13 is selectively provided on a principal surface (upper surface) of a semiconductor substrate 12 made of silicon (Si) or the like. A plurality of photodiodes (not illustrated) serving as light-receiving elements are provided in the light-receiving area 13.

On the upper surface of the semiconductor substrate 12, a plurality of electrode terminals 14 are arranged around the light-receiving area 13 at a distance.

Some of the electrode terminals 14 extend to the other principal surface (lower surface) of the semiconductor substrate 12 via through holes 15 provided in the semiconductor substrate 12, and are coupled to external connection terminals 17 via wiring layers 16 on the lower surface.

A microlens (not illustrated) is provided on the light-receiving area 13 of the solid-state image sensing device 11.

The plate-shaped transparent member 31 is fixed to the upper surface of the semiconductor substrate 12 with a light-shielding adhesive member 21 that surrounds the light-receiving area 13 at a distance.

The adhesive member 21 is spaced from the light-receiving area 13 so as not to have any influence on the light receiving angle (angle of view) of the light-receiving area 13, and the thickness of the adhesive member 21 is also set so as not to have any influence on the light receiving angle of the light-receiving area 13.

In FIG. 1, a broken line L1 indicates the position of an inner end of the adhesive member 21.

The transparent member 31 is formed by a glass plate, a film, or a plastic material having a thickness of, for example, 0.2 to 1.0 mm, and is transparent to the wavelength of light to be received by the solid-state image sensing device 11.

Air is contained in an enclosed space 22 defined by the transparent member 31, the adhesive member 21, and the solid-state image sensing device 11.

Hence, incident light passing through the transparent member 31 effectively enters the light-receiving area 13 of the solid-state image sensing device 11 because of the difference in refractive index between the air and the microlens.

Some of the electrode terminals 14 of the solid-state image sensing device 11 extend to the principal surface (upper surface) of the transparent member 31 through through holes 32 filled in with conductive materials provided in the transparent member 31, and are coupled to circuit elements 41, such as a driving integrated circuit element and a capacitative element, mounted on the upper surface of the transparent member 31.

That is, the through holes 32 provided in the transparent member 31 are filled with a conductive material 33 such as copper (Cu) or tungsten (W). Conductive layers made of a material mainly containing aluminum (Al) and electrode terminals 34 and 35 are provided on exposed portions of the conductive materials 33, that is, on the upper and lower surfaces of the transparent member 31.

Electrodes of the circuit elements 41 are coupled and fixed to electrode terminals 34 provided on the upper surface of the transparent member 31 with solder layers (or conductive adhesive) 36 being disposed therebetween.

As the circuit elements 41, a control integrated circuit element for the solid-state image sensing device 11, a capacitative element applied to a power circuit, a resistor element, etc. are selectively used as necessary, and the number of circuit elements 41 is not limited.

The circuit elements 41 are mounted at positions on the upper surface of the transparent member 31 that do not have any influence on the light receiving angle (angle of view) of the light-receiving area 13 of the solid-state image sensing device 11.

The circuit elements 41 themselves, or the circuit elements 41 and the metal filled in the through holes 32, may be coupled by conductive layers 37 that are selectively provided on the upper surface of the transparent member 31.

The electrode terminals 35 provided on the other principal surface (lower surface, surface facing the solid-state image sensing device 11) of the transparent member 31 are coupled to the electrode terminals 14 of the solid-state image sensing device 11 with solder layers (or conductive adhesive) 38 being disposed therebetween.

The electrode terminals 35 and the solder layers 38 provided on the transparent member 31 and the electrode terminals 14 of the solid-state image sensing device 11 are covered with the adhesive member 21.

Instead of forming the closed space 22, the light-receiving area 13 of the solid-state image sensing device 11 may be in contact with the transparent member 31. In this case, it is preferable to use a transparent adhesive having a refractive index of about 1.3 to 1.6.

Since the circuit elements 41, which are electrically coupled to the solid-state image sensing device 11, are mounted and arranged on the transparent member 31 provided on the solid-state image sensing device 11, a distance therebetween substantially corresponds to the thickness of the transparent member 31.

In other words, the solid-state image sensing device 11 and the circuit elements 41 are coupled with an extremely short distance therebetween. This avoids an increase in wiring resistance and influence of external noise. Hence, malfunctions of the imaging device may be reduced if not prevented.

According to the above-described structure, a wiring board on which the solid-state image sensing device 11 is mounted may not need an area for mounting the circuit elements 41 on the transparent member 31. This further reduces the size of an imaging device module. [0034]

Figure 3:
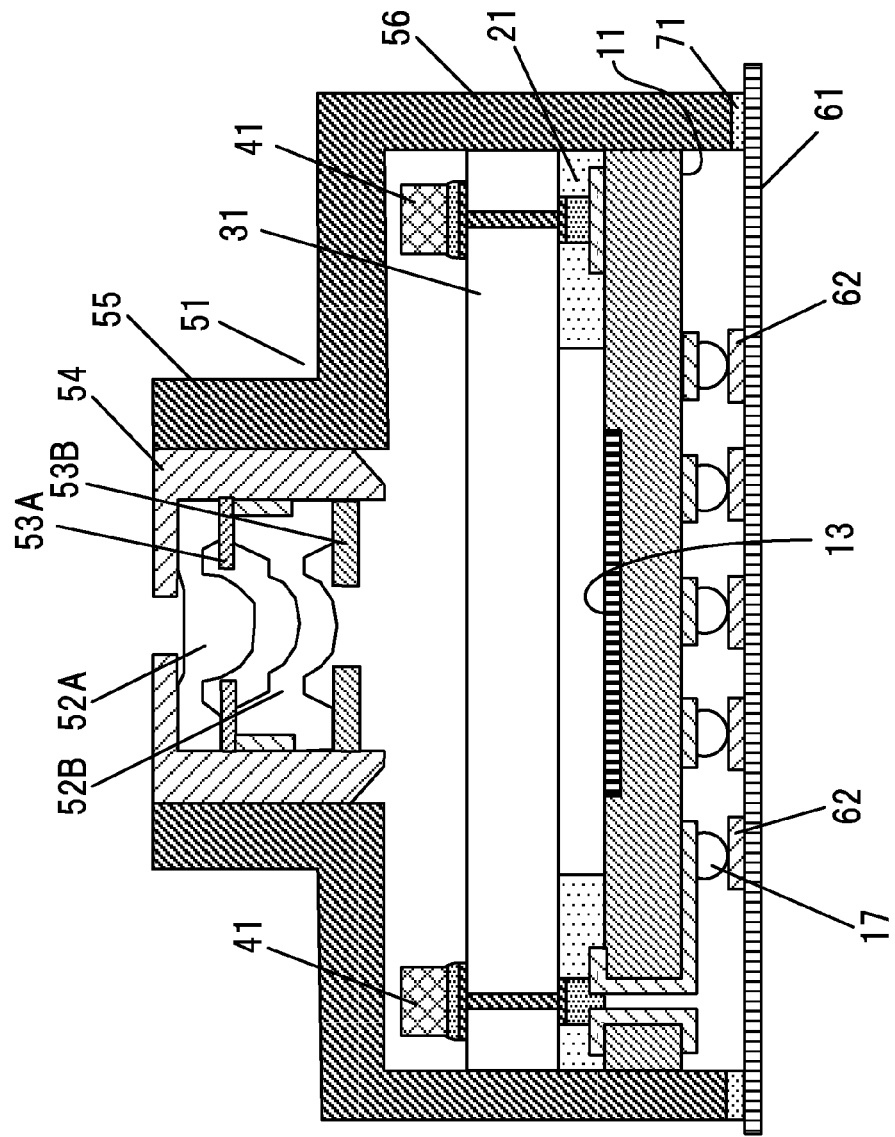
FIG. 3 is a cross-sectional view illustrating a state in which a lens unit is mounted in the imaging device of the first embodiment.

FIG. 3 illustrates a state in which a lens unit 51 is attached to the imaging device 100 of the first embodiment so as to form an imaging device module 150.

In the imaging device module 150, the imaging device 100 is mounted on a wiring board 61, and is substantially covered with the lens unit 51.

That is, the imaging device 100 is mounted on the wiring board 61 with the external connection terminals 17 being coupled to electrodes 62 provided on the principal surface (upper surface) of the wiring board 61.

The lens unit 51 includes a lens tube portion 55 and a support portion 56. The lens tube portion 55 is fitted on a lens holder 54 that contains and holds optical lenses 52A and 52B together with diaphragm members 53A and 53B. The support portion 56 supports the lens tube portion 55 and covers the imaging device 100.

The support portion 56 is fixed to the upper surface of the wiring board 61 with adhesive 71.

The lens tube portion 55 and the support portion 56 in the lens unit 51 are made lightproof by being formed by a light-shielding member or a light-transmissive member having at least a colored surface. Alternatively, a light-shielding member, such as metal, may be formed on a surface of a light-transmissive member.

In the above-described structure, the optical axis of the optical lenses 52A and 52B held in the lens holder 54 is positioned in correspondence with the light-receiving area 13 of the solid-state image sensing device 11.

As well, external connection terminals (not illustrated) for connection to a wiring board (motherboard) or the like in an electronic apparatus are provided on the other principal surface (lower surface) or a peripheral edge of the wiring board 61.

In this imaging device module 150, the circuit elements 41 coupled to the solid-state image sensing device 11 are mounted and arranged on the transparent member 31 that is provided on the light-receiving area 13 of the solid-state image sensing device 11.

Hence, the upper surface of the wiring board 61 does not need an area for mounting the circuit elements 41, so that the support portion 56 of the lens unit 51 is located close to the solid-state image sensing device 11.

This further reduces the size of the imaging device module 150.

According to this structure, the wire length based on the distance between the solid-state image sensing device 11 and the circuit elements 41 is shortened. For this reason, the wiring resistance is not increased, and the influence of external noise is reduced. Hence, stable operation may be realized.

FIGS. 4A to 4E illustrate a production procedure for the imaging device 100 of the first embodiment of the present invention.

Here, a description will be mainly given of processes for realizing a structure for mounting and fixing the circuit elements 41 onto the transparent member 31, which structure is characteristic of the imaging device 100.

Figure 4A:
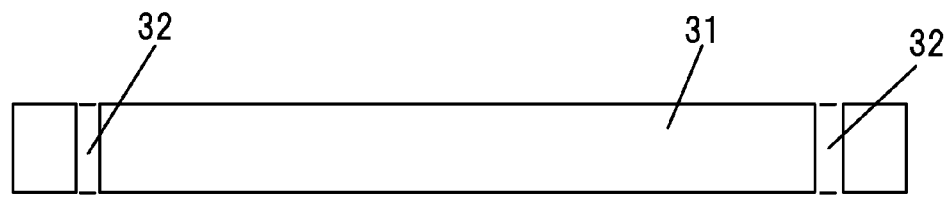
FIGS. 4A to 4E are cross-sectional views illustrating a manufacturing procedure for the imaging device of the first embodiment.

First, as illustrated in FIG. 4A, a glass plate, a synthetic resin plate, or a film plate having a thickness of, for example, 0.2 to 1.0 mm is prepared as a material that forms a transparent member 31, and through holes 32 are selectively formed in the plate.

The through holes 32 may be formed, for example, by laser irradiation or selective etching in accordance with the material of the transparent member 31. Alternatively, the through holes 32 may be formed by mechanical boring using a drill.

In the case of selective etching, the transparent member 31 may be etched from both principal surfaces.

Figure 4B:
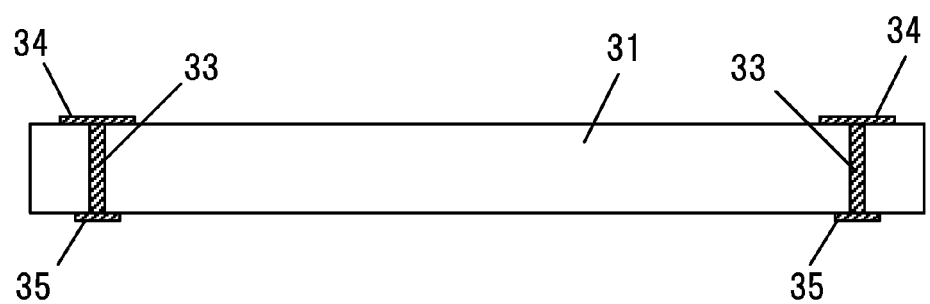

Next, as illustrated in FIG. 4B, the through holes 32 formed in the transparent member 31 are filled with metal, such as copper or tungsten, serving as the conductive material 33. The metal is applied and filled by, for example, plating, chemical vapor deposition, or sputtering in accordance with the bore or cross-sectional shape of the through holes 32.

Electrode terminals 34 and 35 formed of a material mainly containing aluminum are selectively formed on exposed portions of the conductive materials 33 (upper and lower surfaces of the transparent member 31). Instead of the material mainly containing aluminum, copper or silver (Ag) may be adopted.

A single metal may be used to form the electrode terminals 34 and 35, or nickel (Ni) or gold (Au) may be applied onto the surface of the metal.

When a material mainly containing aluminum is used, for example, the metal is applied onto the entire upper (lower) surface of the transparent member 31 by vapor deposition, and is then selectively removed by photo-etching, thereby forming the electrodes 34 and 35.

Figure 4C:
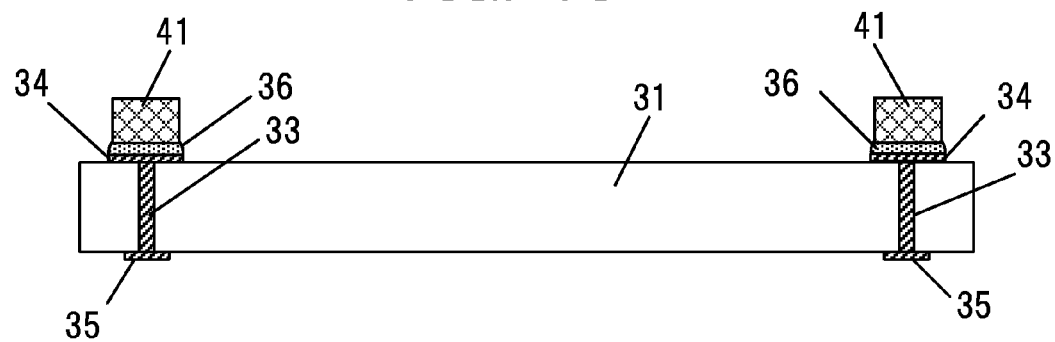

Next, as illustrated in FIG. 4C, solder layers 36 are formed on surfaces of the electrode terminals 34 on the principal surface (upper surface) of the transparent member 31, and circuit elements 41, such as capacitative elements, are placed on the solder layers 36.

Then, the solder layers 36 are melted (reflow) so as to connect and fix electrodes of the circuit elements 41 to the electrode terminals 34.

When a conductive adhesive, such as silver paste, is used instead of the solder, the conductive adhesive is applied onto the surfaces of the electrode terminals 34, and the circuit elements 41 are placed thereon. The conductive adhesive is hardened by heating so as to fix the circuit elements 41.

Figure 4D:
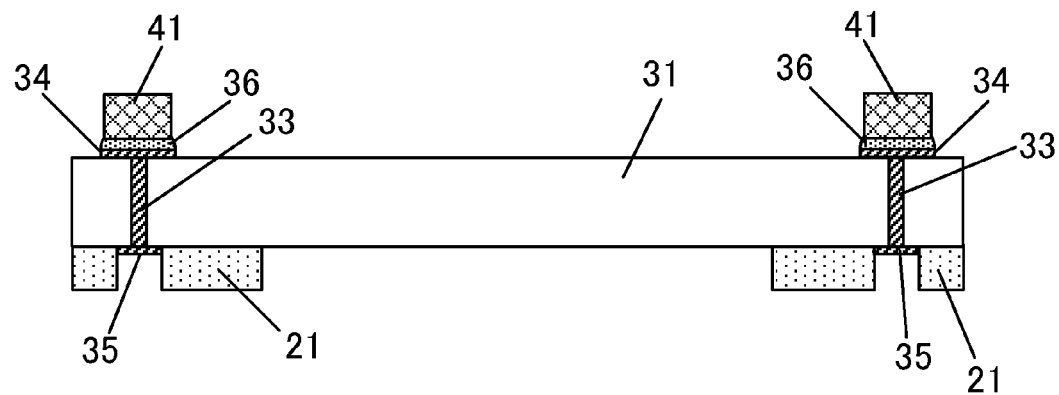

Next, as illustrated in FIG. 4D, an adhesive member 21 is selectively formed around the electrode terminals 35 on the other principal surface (lower surface) of the transparent member 31.

In other words, the adhesive member 21 is selectively formed so as not to cover a light-receiving area 13 of a solid-state image sensing device 11 and the electrode terminals 35.

For example, the adhesive member 21 is selectively formed by selectively applying a tape-shaped adhesive material or coating an adhesive liquid.

On the other hand, a so-called semiconductor device manufacturing process is applied to a semiconductor substrate 12 of silicon or the like, and a plurality of solid-state image sensing devices 11, each including a light-receiving area 13 and peripheral circuits, are formed on the principal surface of the semiconductor substrate 12.

Formation of through holes, filling of the through holes with metal, and formation of wiring layers coupled to the metal filled in the through holes are carried out by the semiconductor device manufacturing process.

Figure 4E:
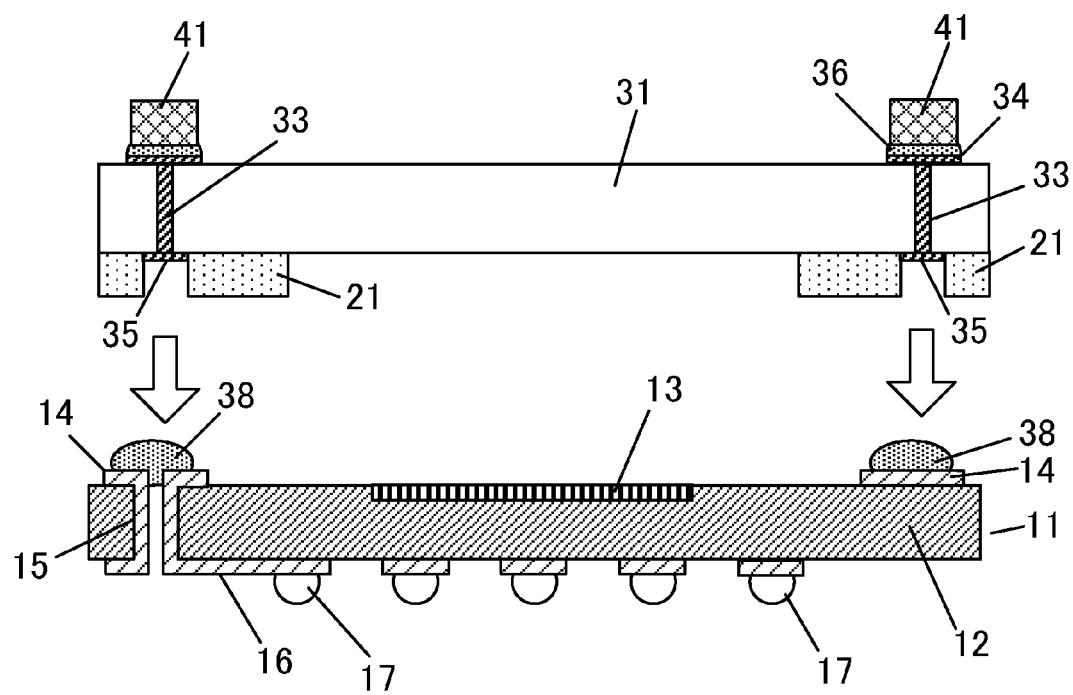

Then, as illustrated in FIG. 4E, convex external connection terminals 17 made of solder or the like are formed on wiring layers 16 that extend to lower surfaces of the solid-state image sensing devices 11.

When the external connection terminals 17 are formed, the semiconductor substrate 12 is singulated into a plurality of solid-state image sensing devices 11.

A detailed description of the production procedure for the solid-state image sensing device 11 is omitted.

Solder layers 38 are formed on electrode terminals 14 on the principal surface (upper surface, surface where the light-receiving area 13 is provided) of the solid-state image sensing device 11, and the lower surface of the transparent member 31 is then aligned to face the upper surface of the solid-state image sensing device 11.

After alignment, the transparent member 31 and the solid-state image sensing device 11 are heated and pressurized, and are thereby fixed together with the adhesive member 21.

In this case, the electrode terminals 14 on the upper surface of the solid-state image sensing device 11 are coupled to the electrode terminals 35 of the transparent member 31 by the solder layers 38.

Through the above-described steps, an imaging device 100 illustrated in FIGS. 1 and 2 is produced.

Next, the imaging device 100 is mounted on a wiring board 61 and a lens unit 51 is placed to cover the imaging device 100, so that an imaging device module 150 is produced.

Alternatively, an electrical connection may be realized by pressurization and thermosetting using an anisotropically conductive resin serving as the adhesive member 21 and convex electrodes serving as the electrode terminals of the solid-state image sensing device 11.

In the imaging device 100, the transparent member 31 may be formed by bonding a plurality of thin transparent materials together.

While the lens unit 51 adopts a structure including two lenses and two diaphragms, the number of lenses and the number of diaphragms are appropriately determined in accordance with the resolution required of the imaging device.

Such alterations in the structure may be similarly applied to lens units of the following embodiments.

Second Embodiment

Figure 5:
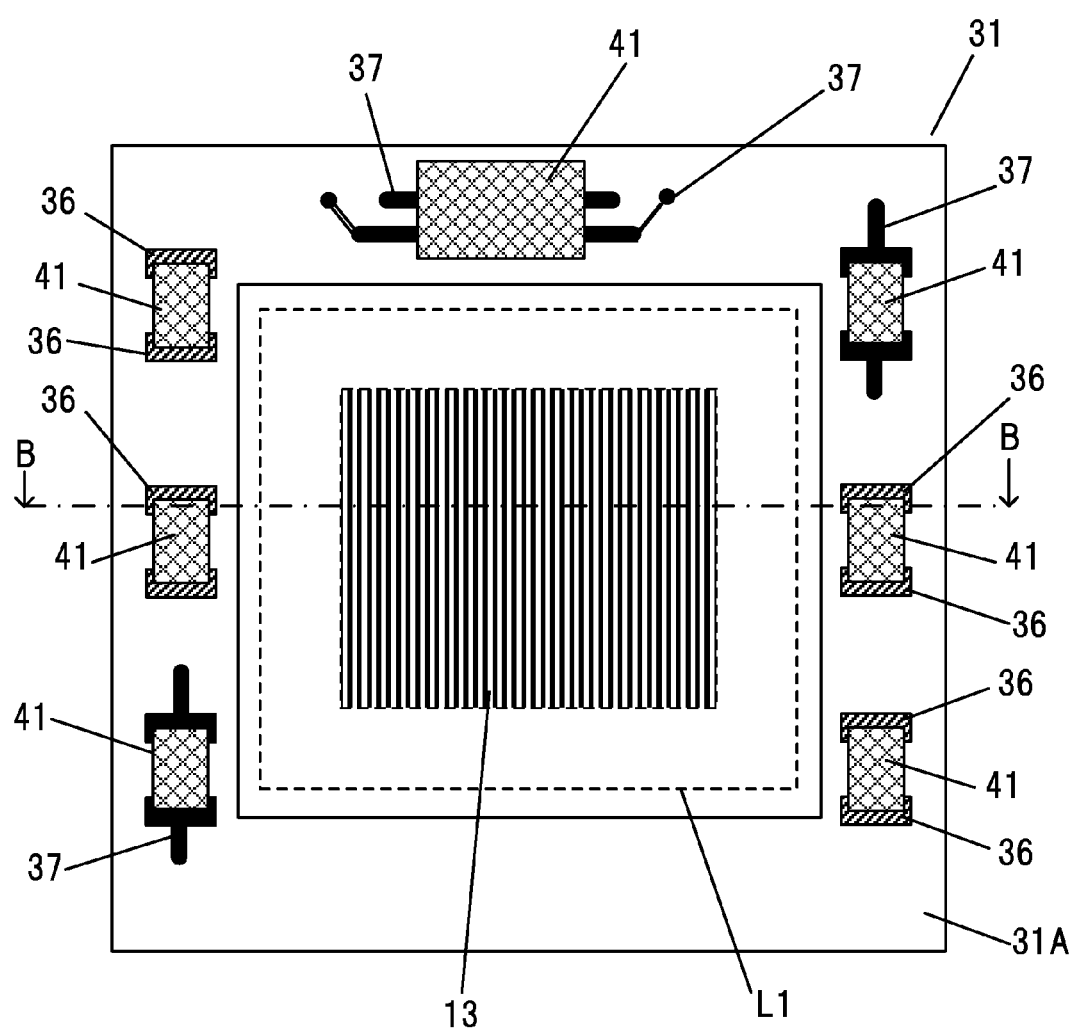
FIG. 5 is a top view of an imaging device according to a second embodiment of the present invention.
Figure 6:
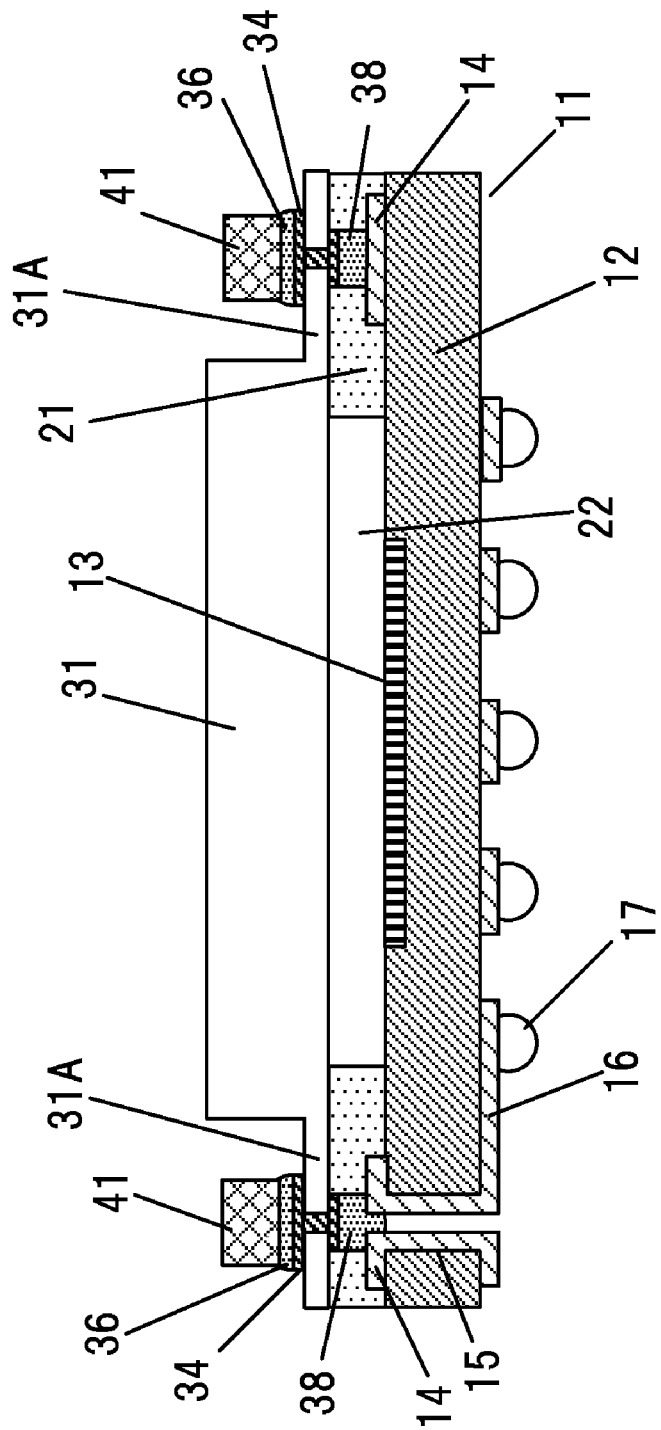
FIG. 6 is a cross-sectional view illustrating a structure of the principal part of the imaging device of the second embodiment.

FIGS. 5 and 6 illustrate an imaging device 200 according to a second embodiment of the present invention.

FIG. 5 is a top view of the imaging device 200 of the second embodiment, and FIG. 6 is a cross-sectional view taken along line B-B in FIG. 5.

Structures corresponding to those adopted in the imaging device 100 of the first embodiment are denoted by the same reference numerals.

In the imaging device 200 of the second embodiment, a plate-shaped transparent member 31 is provided on a light-receiving surface of a solid-state image sensing device 11 formed by a CCD image sensor or a CMOS image sensor.

Circuit elements 41 are arranged at positions on the transparent member 31 that do not have any influence on a light-receiving area 13 of the solid-state image sensing device 11.

In FIG. 5, a broken line L1 indicates the position of an inner end of an adhesive member 21.

The imaging device 200 is different from the first embodiment in the shape of a portion of the transparent member 31 on which the circuit elements 41 are mounted.

That is, the portion of the transparent member 31 on which the circuit elements 41 are mounted is selectively reduced in thickness from the principal surface (upper surface) so as to form a thin portion 31A.

In other words, a portion of the transparent member 31 located on the light-receiving area 13 of the solid-state image sensing device 11 is a so-called thick portion having a specific thickness.

The thick portion is shaped like a rectangular flat plate, and is surrounded by the thin portion 31A.

The thin portion 31A has through holes 32. The circuit elements 41 are mounted and fixed while being coupled to electrode terminals 34 coupled to conductive materials 33 filled in the through holes 32 or coupled to conductive layers 37.

Depending on the number or external dimensions of circuit elements 41 to be mounted, the thin portion 31A surrounding four sides of the thick portion may be replaced with thin portions extending along two opposing sides of the thick portion, and the circuit elements 41 may be mounted in the thin portions. This structure is selected on the assumption that optical performance and reliability of the imaging device are ensured.

In this structure, a height difference between an upper surface of the thin portion 31A of the transparent member 31 and a principal surface (upper surface, upper surface of the thick portion) of the transparent member 31 is set to be larger than the height of the circuit elements 41 that have been mounted and fixed.

Hence, the circuit elements 41 do not protrude from the upper surface of the transparent member 31.

Figure 7:
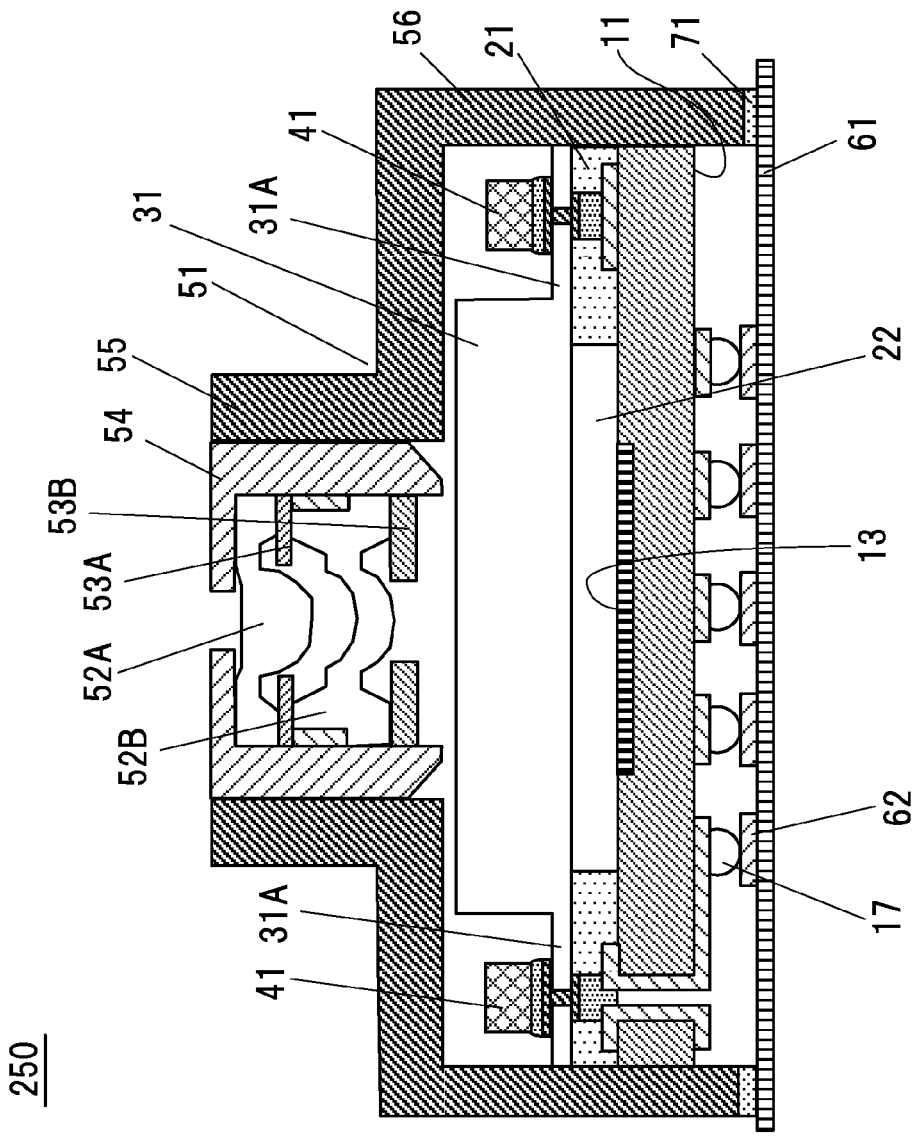
FIG. 7 is a cross-sectional view illustrating a state in which a lens unit is mounted in the imaging device of the second embodiment.

FIG. 7 illustrates a state in which a lens unit 51 is attached to the imaging device 200 of the second embodiment so as to form an imaging device module 250.

In this imaging device module 250, the imaging device 200 is mounted on a wiring board 61, and is covered with the lens unit 51.

That is, the imaging device 200 is mounted on the wiring board 61 with external connection terminals 17 being coupled to electrodes 62 provided on the principal surface of the wiring board 61.

The lens unit 51 includes a lens tube portion 55 and a support portion 56. The lens tube portion 55 is fitted on a lens holder 54 including and holding optical lenses 52A and 52B together with diaphragm members 53A and 53B. The support portion 56 supports the lens tube portion 55 and covers the imaging device 200.

The support portion 56 is fixed onto the principal surface of the wiring board 61 with adhesive 71.

While this lens unit 51 also adopts a structure including two lenses and two diaphragms, the number of lenses and the number of diaphragms are appropriately determined in accordance with the resolution required of the imaging device, as described above.

The lens tube portion 55 and the support portion 56 in the lens unit 51 are made lightproof by being formed by a light-shielding member or a light-transmissive member having at least a colored surface. Alternatively, a light-shielding member, such as metal, may be formed on a surface of a light-transmissive member.

In this structure, the optical axis of the optical lenses 52A and 52B held by the lens holder 54 is positioned in correspondence with the light-receiving area 13 of the solid-state image sensing device 11.

In this imaging device module 250, the circuit elements 41 to be coupled to the solid-state image sensing device 11 are mounted and arranged on the thin portion 31A of the transparent member 31 provided on the solid-state image sensing device 11, as described above.

For this reason, wires penetrating the thin portion 31A are short.

Hence, the wire length based on the distance between the solid-state image sensing device 11 and the circuit elements 41 is further shortened, the wiring resistance is not increased, and the influence of external noise is reduced. This realizes a more stable operation.

Further, since an area or space where the circuit elements 41 are mounted is unnecessary on the principal surface (upper surface, upper surface of the thick portion) of the transparent member 31, the support portion 56 of the lens unit 51 may be located closer to the solid-state image sensing device 11 by at least a height corresponding to the height (thickness) of the circuit elements 41.

Hence, the height (length in the optical axis direction) of the support portion 56 of the lens unit 51 is reduced, and the imaging device module 250 is made smaller (thinner) than the imaging device module 150.

Since the lens system in the imaging device module 250 is located closer to the light-receiving area 13 of the solid-state image sensing device 11, the focal length of the lens system is different from that of the lens system in the imaging device module 150.

FIGS. 8A to 8F illustrate a production procedure for the imaging device 200.

Here, a description will also be mainly given of processes for realizing a structure for mounting and fixing the circuit elements 41 onto the transparent member 31, a structure that is characteristic of the imaging device 200.

Figure 8A:
FIGS. 8A to 8F are cross-sectional views illustrating a manufacturing procedure for the imaging device of the second embodiment.

First, as illustrated in FIG. 8A, a glass plate, a film, or a synthetic resin plate having a thickness of, for example, 0.2 to 1.0 mm is prepared as a member that forms a transparent member 31.

An area of the transparent member 31 where circuit elements 41 are to be mounted is selectively reduced in thickness so as to form a thin portion 31A.

That is, the transparent member 31 is subjected to selective etching or selective machining from the principal surface to reduce the thickness thereof, so that a thin portion 31A having a thickness of about 50 to 250 μm is formed. The thickness of the thin portion 31A is selected such as to obtain a specific mechanical strength.

The height difference produced in the transparent member 31 by selective etching or selective machining is larger than the height of the circuit elements 41 that have been mounted and fixed. As a result, the circuit elements 41 do not protrude from the upper surface of the transparent member 31.

Figure 8B:

Next, as illustrated in FIG. 8B, through holes 32 are selectively formed in the thin portion 31A.

The through holes 32 are formed by a method suited to the material of the transparent member 31, for example, laser irradiation or selective etching. Since the thin portion 31A is thin, the through holes 32 are formed relatively easily.

Figure 8C:

After that, as illustrated in FIG. 8C, the through holes 32 formed in the thin portion 31A of the transparent member 31 are filled with conductive materials 33 formed of metal such as copper or tungsten.

Electrode terminals 34 and 35 made of a material mainly including aluminum are formed on exposed portions of the conductive materials 33 (both upper and lower surfaces of the transparent member 31).

While a single metal may be used to form the electrode terminals 34 and 35, as described above, the electrode terminals 34 and 35 may be coated with nickel or gold.

Figure 8D:
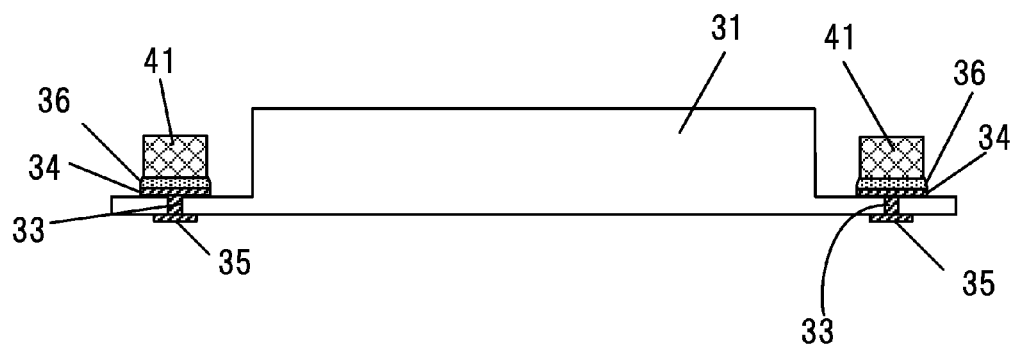

As illustrated in FIG. 8D, solder layers 36 are formed on surfaces of the electrode terminals 34 on the upper surface of the transparent member 31, and circuit elements 41, such as capacitive elements, are placed on the solder layers 36.

The solder layers 36 are melted (reflow) so as to connect and fix electrodes of the circuit elements 41 to the electrode terminals 34.

Figure 8E:

Next, as illustrated in FIG. 8E, an adhesive member 21 is selectively formed around the electrode terminals 35 on the other principal surface (lower surface) of the transparent member 31.

That is, the adhesive member 21 is selectively formed so as not to cover the light-receiving area 13 of the solid-state image sensing device 11 and not to cover the electrode terminals 35.

Figure 8F:
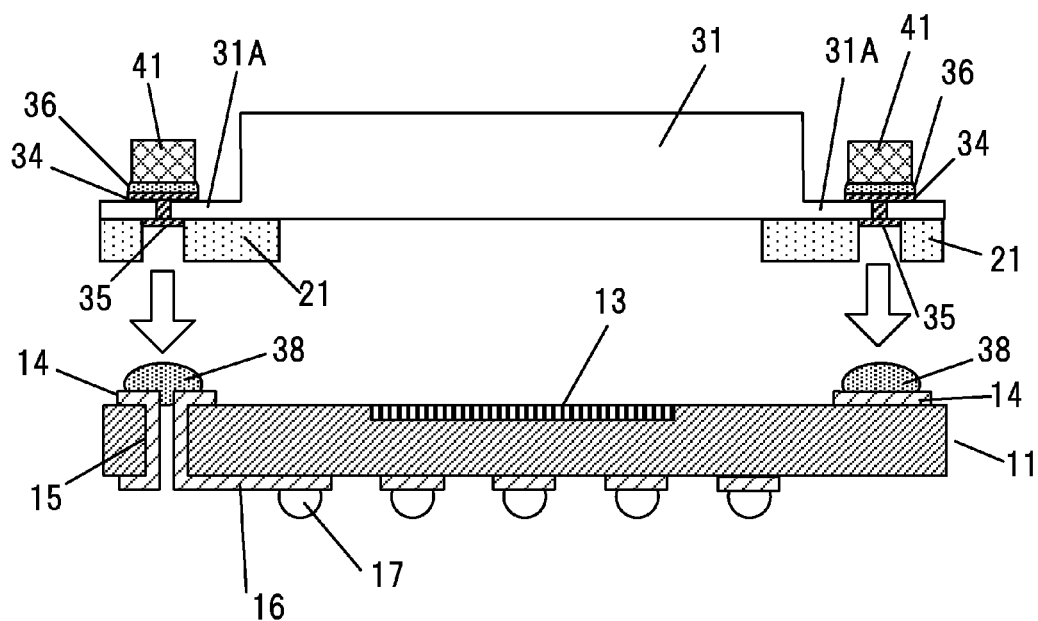

Then, as illustrated in FIG. 8F, solder layers 38 are formed on electrode terminals 14 on the principal surface (upper surface, surface on which a light-receiving area 13 is provided) of the solid-state image sensing device 11, and the other principal surface (lower surface) of the transparent member 31 is then placed to face the upper surface of the solid-state image sensing device 11.

After alignment and stacking, the transparent member 31 is fixed onto the solid-state image sensing device 11 with the adhesive member 21 by the application of heat and pressure.

In this case, the electrode terminals 14 on the upper surface of the solid-state image sensing device 11 are coupled to the electrode terminals 35 of the transparent member 31 by solder layers 38.

Through the above-described steps, an imaging device 200 illustrated in FIGS. 5 and 6 is produced.

In the imaging device 200, the transparent member 31 may also be formed by bonding a plurality of transparent materials together.

Third Embodiment

Figure 9:
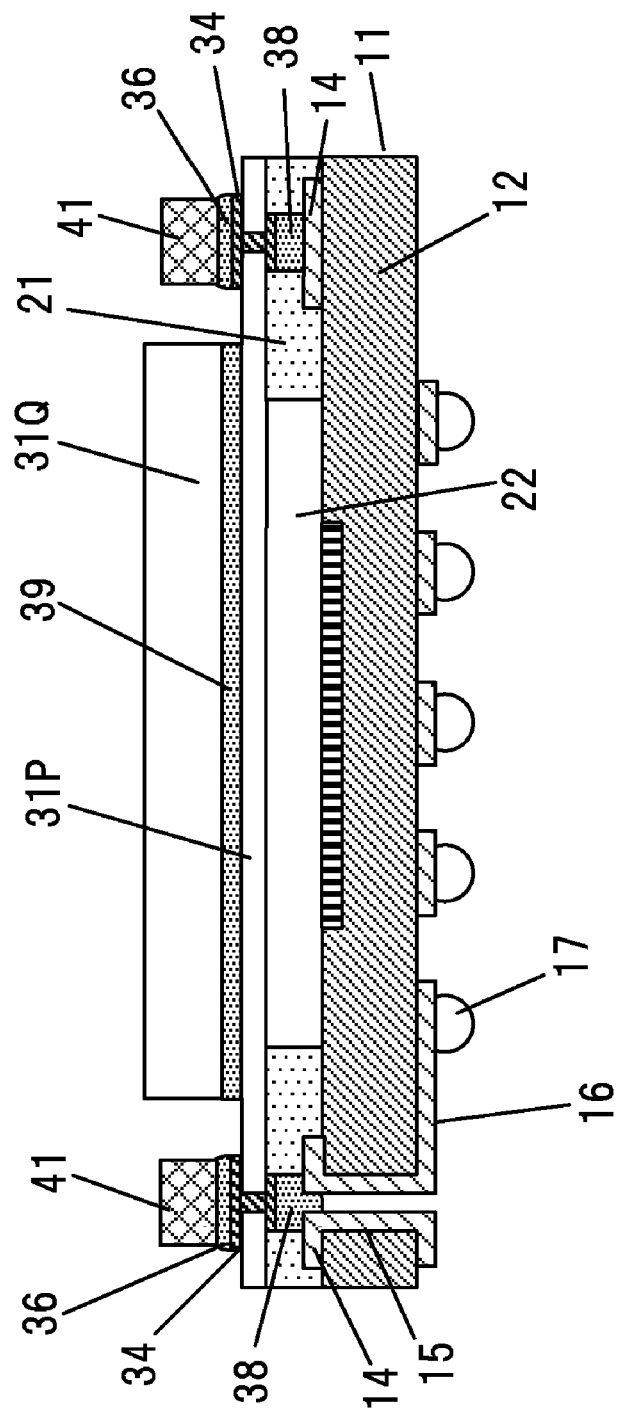
FIG. 9 is a cross-sectional view illustrating a structure of the principal part of an imaging device according to a third embodiment of the present invention.

FIG. 9 illustrates an imaging device 300 according to a third embodiment of the present invention.

Structures corresponding to those adopted in the imaging device 100 of the first embodiment are denoted by the same reference numerals.

In the imaging device 300 of the third embodiment, a plate-shaped transparent member 31 is also provided on a light-receiving surface of a solid-state image sensing device 11 formed by a charge coupled device (CCD) image sensor or a complementary metal-oxide semiconductor (CMOS) image sensor.

Circuit elements 41 are provided at positions that do not have any influence on a light-receiving area 13 of the solid-state image sensing device 11.

The imaging device 300 is different from the second embodiment in the structure of a thin portion provided in the transparent member 31.

That is, the transparent member 31 includes a transparent member 31P and a transparent member 31Q.

The transparent member 31P is a thin member including a portion on which the circuit elements 41 are mounted and a portion facing the light-receiving area 13 of the solid-state image sensing device 11.

In contrast, the transparent member 31Q is a thick member fixed onto the principal surface of the transparent member 31P with adhesive 39 at a position facing the light-receiving area 13 of the solid-state image sensing device 11, and is located at almost the center of the transparent member 31P. The transparent member 31Q is shaped like a rectangular flat plate.

The transparent member 31P has through holes, and the circuit elements 41 are mounted and fixed onto electrode terminals coupled to conductive materials filled in the through holes.

In other words, a portion of the transparent member 31P located around and outside the transparent member 31Q corresponds to the thin portion 31A in the second embodiment.

A height difference between an upper surface of the transparent member 31P and the principal surface (upper surface) of the transparent member 31Q is set to be larger than the height of the circuit elements 41 that have been mounted and fixed. For this reason, the circuit elements 41 do not protrude from the upper surface of the transparent member 31Q.

The thickness of the adhesive 39 is determined so as to contribute to formation of such a height difference.

Since the circuit elements 41 do not protrude from the upper surface of the transparent member 31Q, the height (length in the optical axis direction) of the above-described support portion 56 of the lens unit 51 is reduced by at least an amount corresponding to the height (thickness) of the circuit elements 41.

Hence, the size (height) of an imaging device module including the imaging device 300 is smaller than the size of the above-described imaging device module 150.

FIGS. 10A to 10D illustrate a production procedure for the imaging device 300.

Here, a description will also be mainly given of processes for mounting and fixing circuit elements 41 onto a transparent member 31 having a two-layer structure.

Figure 10A:
FIGS. 10A to 10D are cross-sectional views illustrating a manufacturing procedure for the imaging device of the third embodiment.

First, as illustrated in FIG. 10A, a glass plate, a film, or a synthetic resin plate that forms a thin transparent member 31P is prepared. The thickness of the transparent member 31P is set at 50 to 250 μm.

Through holes 32 are formed in the transparent member 31P, for example, by laser irradiation or selective etching.

The through holes 32 may be formed by a method suited to the material of the transparent member 31P, for example, by laser irradiation or selective etching. Since the thin plate is thin, the through holes 32 are formed easily.

Figure 10B:
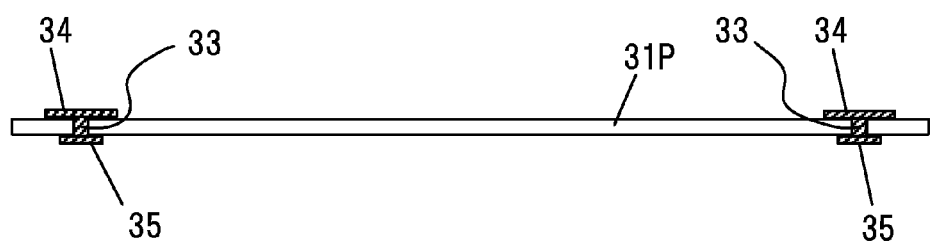

After that, as illustrated in FIG. 10B, the through holes 32 formed in the transparent member 31P are filled with conductive materials 33 of copper or tungsten.

Electrode terminals 34 and 35 made of a material mainly including aluminum are formed on exposed portions of the conductive materials 33 (both upper and lower surfaces of the transparent member 31P).

While a single metal may be used to form the electrode terminals 34 and 35, the electrode terminals 34 and 35 may be coated with nickel or gold.

Figure 10C:
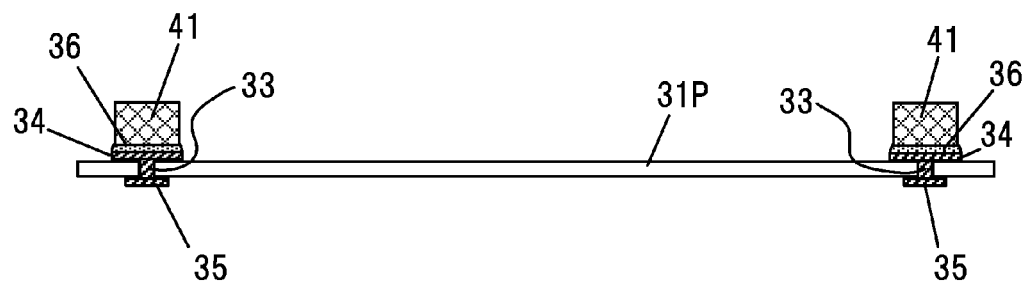

Next, as illustrated in FIG. 10C, solder layers 36 are formed on surfaces of the electrode terminals 34 on the principal surface (upper surface) of the transparent member 31P, and circuit elements 41, such as capacitative elements, are placed on the solder layers 36.

Subsequently, the solder layers 36 are melted (reflow) so as to connect and fix electrodes of the circuit elements 41 to the electrode terminals 34.

Figure 10D:
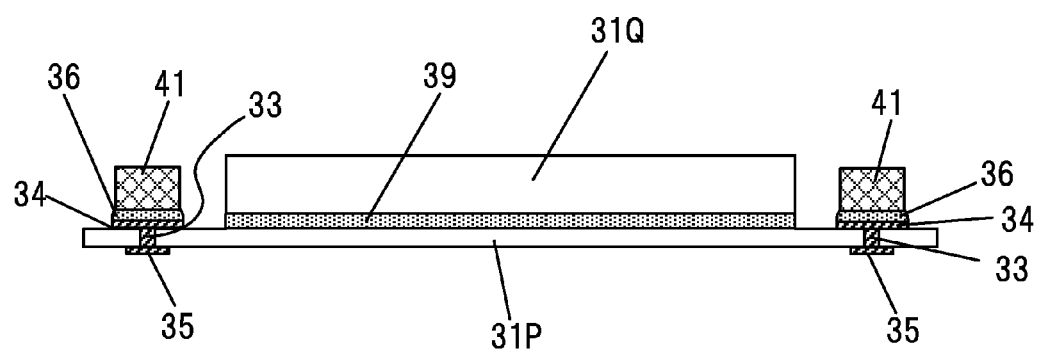

After that, as illustrated in FIG. 10D, a thick transparent member 31Q is placed and fixed onto the transparent member 31P with adhesive 39 to face a light-receiving area 13 of a solid-state image sensing device 11.

In this case, the thickness of the transparent member 31Q and the thickness of the adhesive 39 are determined so that a height difference between the principal surface (upper surface) of the transparent member 31Q including the adhesive 39 and the upper surface of the transparent member 31P is larger than the height of the upper surfaces of the circuit elements 41.

As the adhesive 39, an acrylic adhesive having a refractive index of about 1.3 to 1.6 may be used.

In the imaging device 300, the transparent member 31Q may also be formed by bonding a plurality of thin plate-shaped transparent materials together.

Fourth Embodiment

Figure 11A:
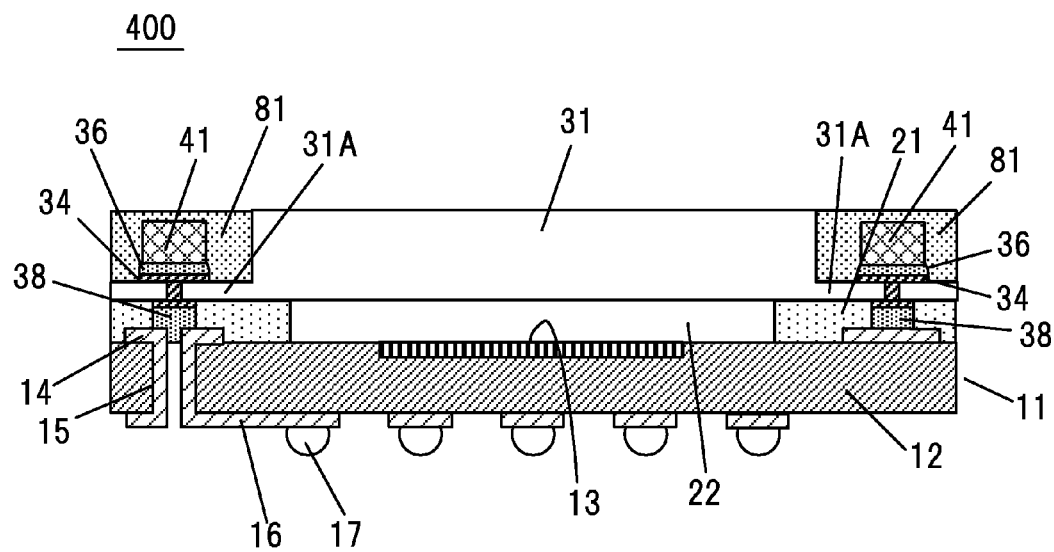
FIGS. 11A and 11B are cross-sectional views illustrating a structure of the principal part of an imaging device according to a fourth embodiment of the present invention.
Figure 11B:
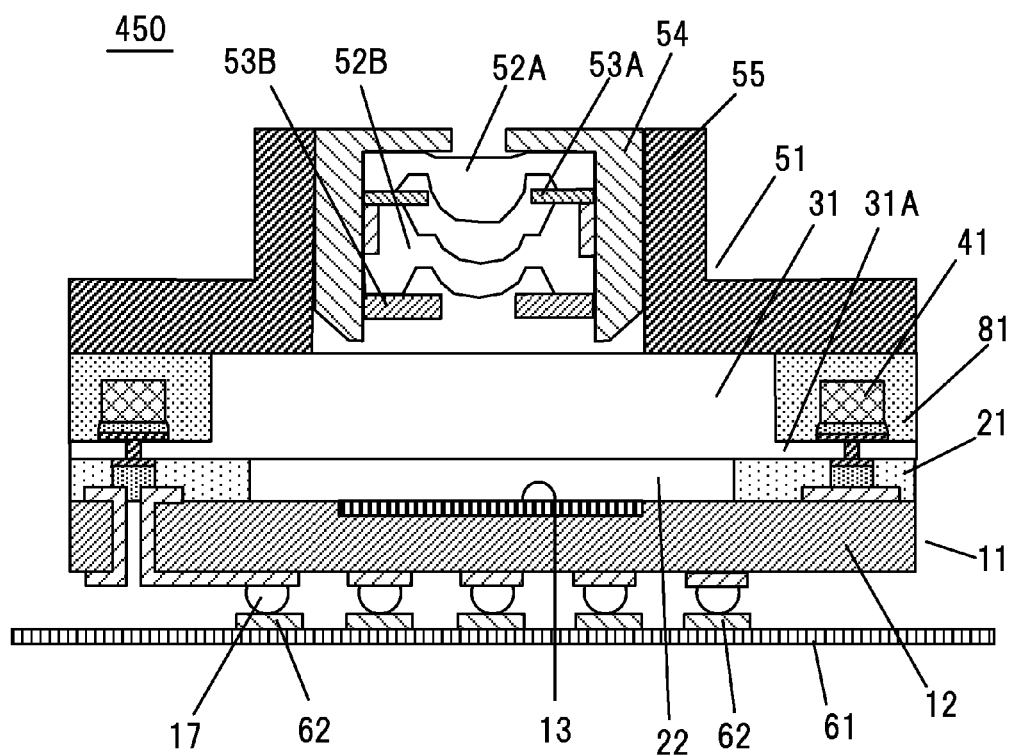

FIGS. 11A and 11B illustrate an imaging device 400 according to a fourth embodiment of the present invention.

Structures corresponding to those adopted in the imaging device 100 of the first embodiment are denoted by the same reference numerals.

Referring to FIG. 11A, in the imaging device 400, a transparent member 31 is provided on a light-receiving surface of a solid-state image sensing device 11 formed by a CCD image sensor or a CMOS image sensor. Light-shielding resin 81, such as black resin, is provided on a thin portion 31A of the transparent member 31 where circuit elements 41 are mounted. The resin 81 covers the circuit elements 41, and makes up a height difference between an upper surface of the thin portion 31A and the principal surface (upper surface) of the transparent member 31.

The resin 81 also seals the circuit elements 41.

Since the light-shielding resin 81 is thus provided, light is prevented from entering the light-receiving area 13 through side faces of the transparent member 31, and this protects the circuit elements 41.

Further, since the light-shielding resin 81 produces an aperture effect, good image signals are obtained.

Since the resin 81 is provided on the thin portion 31A of the transparent member 31 to cover the circuit elements 41 and to make up (eliminate) the height difference between the upper surface of the thin portion 31A and the upper surface of the transparent member 31, the upper surface of the transparent member 31 and an upper surface of the resin 81 form a continuous flat surface.

The presence of the continuous flat surface allows a lens unit 51 to be mounted easily, and simplifies the structure of the lens unit 51 in an imaging device module.

Moreover, the optical axis of the lens unit 51 is easily aligned with the light-receiving area 13 of the solid-state image sensing device 11.

That is, as illustrated in FIG. 11B, in an imaging device module 450 to which the imaging device 400 is applied, the lens unit 51 is mounted and arranged to cover the upper surface of the transparent member 31 and the upper surface of the resin 81 provided on the thin portion 31A of the transparent member 31.

While the lens unit 51 also has a structure including two lenses and two diaphragms, the number of lenses and the number of diaphragms are appropriately determined in accordance with the resolution required of the imaging device, as described above.

In the imaging device module 450, the circuit elements 41 are mounted and arranged on the thin portion 31A of the transparent member 31 provided on the solid-state image sensing device 11, as described above.

For this reason, wires penetrating the thin portion 31A of the transparent member 31 are short.

Hence, the wire length based on the distance between the solid-state image sensing device 11 and the circuit elements 41 is further reduced, the wiring resistance is not increased, and the influence of external noise is reduced. This realizes a more stable operation.

Since the height of the circuit elements 41 does not exceed the height of the upper surface of the transparent member 31, the height (length in the optical axis direction) of a support portion 56 of the lens unit 51 is reduced. Thus, the size (height) of the imaging device module 450 is made smaller than the size of the imaging device module 150.

In other words, since the height of the circuit elements 41 does not exceed the height of the upper surface of the transparent member 31 in the imaging device module 450, the height (length in the optical axis direction) of the support portion 56 of the lens unit 51 is reduced.

In addition, the light-shielding resin 81 is provided to cover the circuit elements 41 and to make up the height difference in the transparent member 31, light is prevented from entering the light-receiving area 13 of the solid-state image sensing device 11 through the side faces of the transparent member 31.

Hence, there is no need to cover the side faces and the thin portion 31A of the transparent member 31 by the support portion 56 in the lens unit 51.

With the above-described structure, the height (length in the optical axis direction) of the support portion 56 of the lens unit 51 is reduced, and the size (diameter) of the lens unit 51 is reduced by an amount corresponding to the thickness of the support portion 56 covering an outer peripheral surface of the imaging device 400.

A lens system of the imaging device module 450 is also located closer to the light-receiving area 13 of the solid-state image sensing device 11, and the focal length of the lens system is different from the focal length of the lens system of the imaging device module 150.

According to this structure, since the support portion 56 of the lens unit 51 is not in contact with a wiring board 61, the area of the wiring board 61 may be reduced.

To prevent light from entering from an outer peripheral end face of the thin portion 31A of the transparent member 31, a light-shielding coating may be applied on the outer peripheral end face.

In this case, the light-shielding coating may be formed by extending the support portion 56 of the lens unit 51 to cover the outer peripheral end face of the thin portion 31A of the transparent member 31 (not illustrated).

The lens unit 51 may be fitted on the imaging device 400 by extending the support portion 56.

This structure of the imaging device module 450 may be similarly applied to the imaging device 300 of the third embodiment.

Fifth Embodiment

Figure 12A:
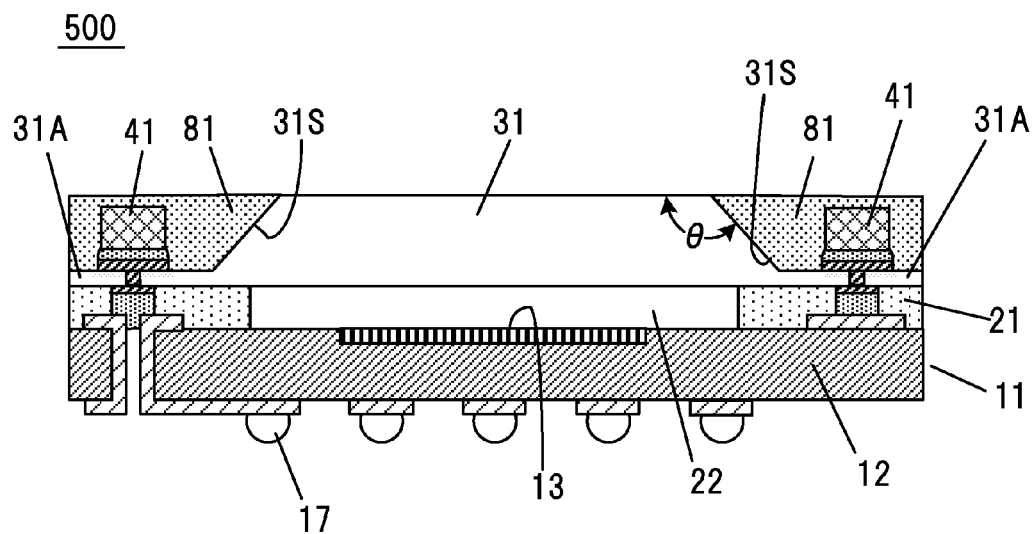
FIGS. 12A and 12B are cross-sectional views illustrating a structure of the principal part of an imaging device according to a fifth embodiment of the present invention.
Figure 12B:
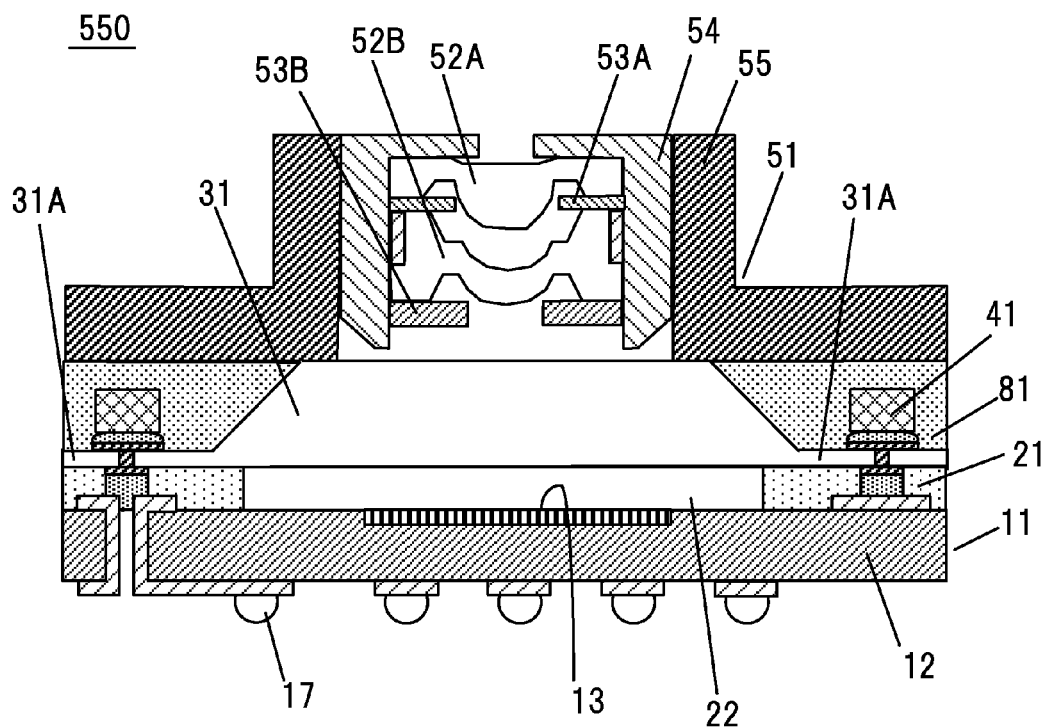

FIGS. 12A and 12B illustrate an imaging device 500 according to a fifth embodiment of the present invention.

Structures corresponding to those adopted in the imaging device 100 of the above-described first embodiment are denoted by the same reference numerals.

In the imaging device 500 of the fifth embodiment, as illustrated in FIG. 12A, a transparent member 31 is provided on a light-receiving surface of a solid-state image sensing device 11 formed by a CCD image sensor or a CMOS image sensor, and a side face 31S of a thick portion of the transparent member 31 is inclined inward, that is, toward a light-receiving area 13 of the solid-state image sensing device 11.

Thus, the side face 31S of the thick portion of the transparent member 31 is inclined at an obtuse angle θ to the principal surface (upper surface) of the transparent member 31.

Light-shielding resin 81, such as black resin, is provided to cover the side face 31S of the transparent member 31 and circuit elements 41, and to make up a height difference between an upper surface of a thin portion 31A of the transparent member 31 and the upper surface of the transparent member 31.

The resin 81 also seals the circuit elements 41.

Since the side face 31S of the transparent member 31 is thus formed by an inclined face, light obliquely incident from the upper surface of the transparent member 31 is reflected by the inclined face, and is reduced if not prevented from entering the light-receiving area 13 of the solid-state image sensing device 11.

Further, since the light-shielding resin 81 is provided, light passing through the inclined side face 31S of the transparent member 31 is reduced if not prevented from entering the light-receiving area 13, and the circuit elements 41 are protected. In addition, since the light-shielding resin 81 also produces an aperture effect, good image signals are obtained.

Since the resin 81 is provided on the thin portion 31A of the transparent member 31 to cover the circuit elements 41 and to make up (eliminate) the height difference between the upper surface of the thin portion 31A and the upper surface of the transparent member 31, a continuous flat surface is formed by the upper surface of the transparent member 31 and a surface of the resin 81.

The presence of the continuous flat surface allows a lens unit 51 to be mounted easily, and simplifies the structure of the lens unit 51 in the imaging device module.

In addition, the optical axis of the lens unit 51 is easily aligned with the light-receiving area 13 of the solid-state image sensing device 11.

In other words, as illustrated in FIG. 12B, in an imaging device module 550 to which the imaging device 500 is applied, the lens unit 51 is mounted and arranged to cover the upper surface of the transparent member 31 and the upper surface of the resin 81 provided on the thin portion 31A of the transparent member 31.

While the lens unit 51 also has a structure including two lenses and two diaphragms, the number of lenses and the number of diaphragms are appropriately determined in accordance with the resolution required of the imaging device, as described above.

In the imaging device module 550, the circuit elements 41 to be coupled to the solid-state image sensing device 11 are mounted and arranged on the thin portion 31A of the transparent member 31 provided on the solid-state image sensing device 11.

For this reason, wires penetrating the thin portion 31A of the transparent member 31 are short.

Hence, the length of the wire length based on the difference between the solid-state image sensing device 11 and the circuit elements 41 is further shortened, the wiring resistance is not increased, and the influence of external noise is reduced. This achieves a more stable operation of the imaging device.

Since the height of the circuit elements 41 does not exceed the height of the upper surface of the transparent member 31, the height (length in the optical axis direction) of a support portion 56 of the lens unit 51 is reduced. With this structure, the size (height) of the imaging device module 550 is made smaller than the size of the imaging device module 150.

In other words, since the height of the circuit elements 41 does not exceed the height of the upper surface of the transparent member 31 in the imaging device module 550, the height (length in the optical axis direction) of the support portion 56 of the lens unit 51 is reduced.

In addition, since the light-shielding resin 81 is provided to cover the circuit elements 41 and to make up the height difference in the transparent member 31, light is prevented from entering the light-receiving area 13 of the solid-state image sensing device 11 from side faces of the transparent member 31.

Therefore, there is no need to cover the side faces and the thin portion 31A (stepped portion) of the transparent member 31 by the support portion 56 of the lens unit 51.

With this structure, the height (length in the optical direction) of the support portion 56 of the lens unit 51 is reduced, and the size (diameter) of the lens unit 51 is reduced by an amount corresponding to the thickness of the support portion 56 covering an outer peripheral side face of the imaging device 500.

As well, a lens system of the imaging device module 550 is also located closer to the light-receiving area 13 of the solid-state image sensing device 11, and the focal length of the lens system is different from the focal length of the lens system of the imaging device module 150.

In this structure, since the support portion 56 of the lens unit 51 is not in contact with a wiring board 61, the area of the wiring board 61 may be reduced.

To reduce or prevent light from entering from an outer peripheral end face of the thin portion 31A of the transparent member 31, a light-shielding coating may be applied onto the outer peripheral end face.

In this case, the light-shielding coating may be formed by extending the support portion 56 of the lens unit 51 to cover the outer peripheral end face of the thin portion 31A of the transparent member 31 (not illustrated).

The lens unit 51 may be fitted on the imaging device 500 by extending the support portion 56.

This structure in which the side face 31S of the transparent member 31 is inclined inward, that is, toward the light-receiving area 13 may be similarly applied to the thick transparent member 31Q adopted in the imaging device 300 of the third embodiment.

Sixth Embodiment

Figure 13A:
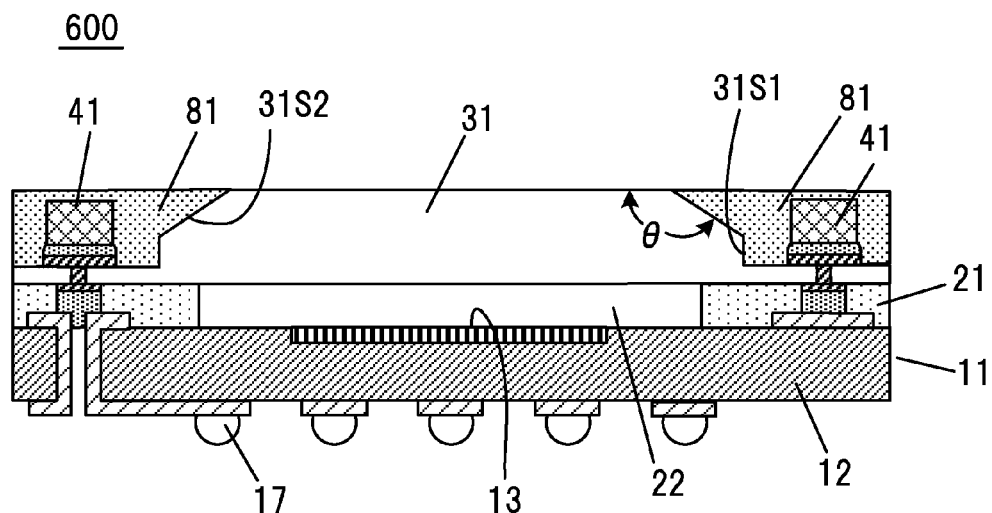
FIGS. 13A and 13B are cross-sectional views illustrating a structure of the principal part of an imaging device according to a sixth embodiment of the present invention.
Figure 13B:
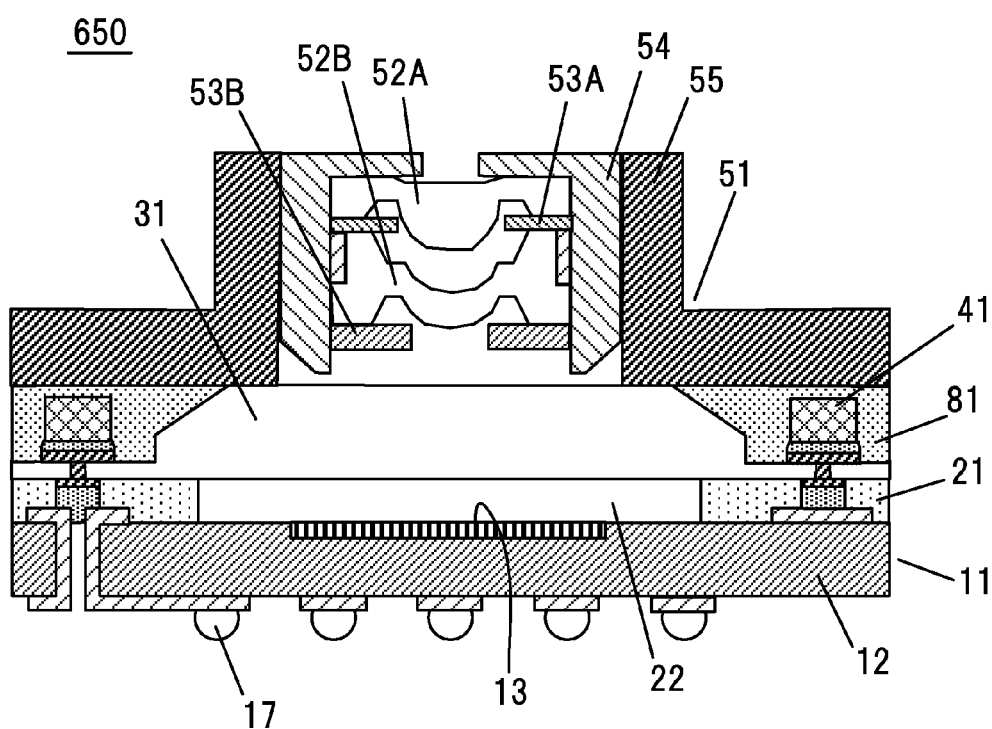
Figure 14:
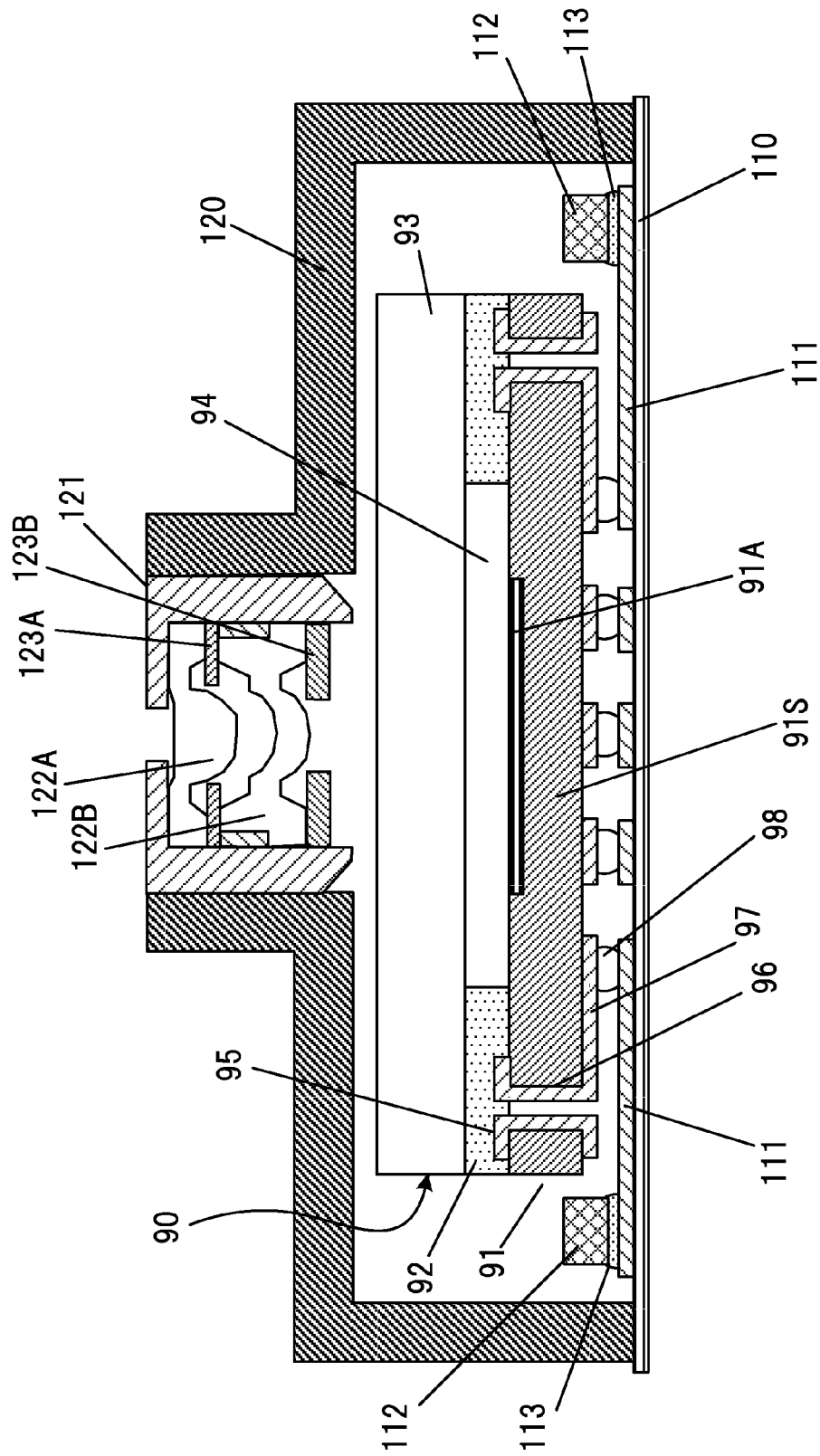
FIG. 14 is a cross-sectional view illustrating a structure of an imaging device of the related art including a lens unit.

FIGS. 13A and 13B illustrate an imaging device 600 according to a sixth embodiment of the present invention.

Structures corresponding to those adopted in the imaging device 100 of the above-described first embodiment are denoted by the same reference numerals.

In the imaging device 600 of the sixth embodiment, as illustrated in FIG. 13A, a transparent member 31 is provided on a light-receiving surface of a solid-state image sensing device 11 formed by a CCD image sensor or a CMOS image sensor, and a side face of a thick portion of the transparent member 31 includes a side face portion 31S1 substantially vertically standing from an upper surface of a thin portion 31A of the transparent member 31, and a side face portion 31S2 coupled to the side face portion 31S1 and inclined inward, that is, toward a light-receiving area 13 of a solid-state image sensing device 11.

The inclined side face portion 31S2 has an obtuse inclined angle θ with respect to the principal surface (upper surface) of the transparent member 31.

Light-shielding resin 81, such as black resin, is provided to cover the substantially vertical side face portion 31S1 and the inclined side face portion 31S2 of the transparent member 31 and circuit elements 41 and to make up a height difference between the upper surface of the thin portion 31A and the upper surface of the transparent member 31.

The resin 81 also seals the circuit elements 41.

Since the side face of the transparent member 31 thus includes the substantially vertical side face portion 31S1 and the inclined side face portion 31S2 coupled to the side face portion 31S1, light obliquely incident from the upper surface of the transparent member 31 is reflected by the inclined side face portion 31S2, and does not enter the light-receiving area 13 of the solid-state image sensing device 11.

Moreover, since the substantially vertical side face portion 31S1 is provided, the contact area between the transparent member 31 and the resin 81 is increased. This increases adhesiveness between the transparent member 31 and the resin 81, and reduces if not prevents the resin 81 from peeling off.

Further, since the light-shielding resin 81 is provided, light is prevented from entering the light-receiving area 13 through the substantially vertical side face portion 31S1 and the inclined side face portion 31S2 of the transparent member 31, and the circuit elements 41 are protected.

In addition, since the light-shielding resin 81 also produces an aperture effect, good image signals are obtained.

Since the resin 81 is provided on the thin portion 31A of the transparent member 31 to cover the circuit elements 41 and to make up (eliminate) the height difference between the upper surface of the thin portion 31A and the upper surface of the transparent member 31, a continuous flat surface is formed by the upper surface of the transparent member 31 and the upper surface of the resin 81.

The presence of the continuous flat surface allows a lens unit 51 to be mounted easily, and simplifies the structure of the lens unit 51 in the imaging device module.

Further, the optical axis of the lens unit 51 is easily aligned with the light-receiving area 13 of the solid-state image sensing device 11.

That is, as illustrated in FIG. 13B, in an imaging device module 650 to which the imaging device 600 is applied, the lens unit 51 is mounted and arranged to cover the upper surface of the transparent member 31 and the upper surface of the resin 81 provided on the thin portion 31A of the transparent member 31.

While the lens unit 51 has a structure including two lenses and two diaphragms, the number of lenses and the number of diaphragms are appropriately determined in accordance with the resolution required of the imaging device, as described above.

In the imaging device module 650, the circuit elements 41 to be coupled to the solid-state image sensing device 11 are mounted and arranged on the thin portion 31A of the transparent member 31 provided on the solid-state image sensing device 11, as described above.

For this reason, wires penetrating the thin portion 31A of the transparent member 31 are short.

Hence, the wire length based on the distance between the solid-state image sensing device 11 and the circuit elements 41 is further reduced, the wiring resistance is not increased, and the influence of external noise is reduced. This realizes a more stable operation.

Since the height of the circuit elements 41 does not exceed the height of the upper surface of the transparent member 31, the height (length in the optical axis direction) of a support portion 56 of the lens unit 51 is reduced.

With this structure, the size (height) of the imaging device module 650 is made smaller than the size of the imaging device module 150.

In other words, since the height of the circuit elements 41 does not exceed the height of the upper surface of the transparent member 31 in the imaging device module 650, the height (length in the optical axis direction) of the support portion 56 of the lens unit 51 is reduced.

Further, since the light-shielding resin 81 is provided to cover the circuit elements 41 and to make up the height difference in the transparent member 31, light is prevented from entering the light-receiving area 13 of the solid-state image sensing device 11 from side faces of the transparent member 31.

Hence, there is no need to cover the side faces and the thin portion 31A (stepped portion) of the transparent member 31 by the support portion 56 in the lens unit 51.

With this structure, the height (length in the optical axis direction) of the support portion 56 of the lens unit 51 is reduced, and the size (diameter) of the lens unit 51 is reduced by an amount corresponding to the thickness of the support portion 56 covering an outer peripheral side face of the imaging device 600.

A lens system of the imaging device module 650 is also located closer to the light-receiving area 13 of the solid-state image sensing device 11, and the focal length of the lens system is different from that of the lens system of the imaging device module 150.

In this structure, since the support portion 56 of the lens unit 51 is not in contact with a wiring board 61, the area of the wiring board 61 may be reduced.

To reduce or prevent light from entering from an outer peripheral end face of the thin portion 31A of the transparent member 31, a light-shielding coating may be applied onto the outer peripheral end face.

In this case, the light-shielding coating may be formed by extending the support portion 56 of the lens unit 51 to cover the outer peripheral end face of the thin portion 31A of the transparent member 31 (not illustrated).

The lens unit 51 may be fitted on the imaging device 500 by extending the support portion 56.

The structure of the side face 31S of the thick portion of the transparent member 31 including the side face portion 31S1 substantially vertically standing from the surface of the transparent member 31 and the side face portion 31S2 coupled to the side face portion 31S1 and inclined inward, that is, toward the light-receiving area 13 may be similarly applied to the thick transparent member 31Q adopted in the above-described imaging device 300.

In the above-described imaging devices 400, 500, and 600, the transparent member 31 may be formed by bonding a plurality of thin plate-shaped transparent materials together.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An imaging device comprising:
   an image sensing device provided on a semiconductor substrate;
   a transparent member provided on a light-receiving area of the image sensing device; and
   a circuit element provided on the transparent member,
   wherein the image sensing device and the circuit element are electrically coupled to each other,
   wherein the transparent member includes a thick portion having a first thickness that corresponds to a thickness of the light-receiving area, and a thin portion having a second thickness smaller than the first thickness, and
   wherein the circuit element is provided on the thin portion.

2. The imaging device according to claim 1, wherein an upper portion of the circuit element is lower than an upper surface of the thick portion of the transparent member.

3. The imaging device according to claim 2, wherein a resin material for sealing the circuit element is provided on the thin portion.

4. The imaging device according to claim 3, wherein the resin material is lightproof.

5. The imaging device according to claim 1, wherein a side face of the thick portion is inclined so that an angle formed between an upper surface of the thick portion and the side face of the thick portion is obtuse.

6. The imaging device according to claim 1, wherein the side face of the thick portion includes a first face provided perpendicularly to an upper surface of the thick portion and above the thin portion, and a second face provided at an obtuse angle to the upper surface of the thick portion and is continuous with the first face.

* * * * *